(12) United States Patent
Watanabe et al.

(10) Patent No.: US 11,890,702 B2
(45) Date of Patent: Feb. 6, 2024

(54) SOLDER JOINT

(71) Applicant: FUJI ELECTRIC CO., LTD., Kawasaki (JP)

(72) Inventors: Hirohiko Watanabe, Hachioji (JP); Shunsuke Saito, Hachioji (JP); Takeshi Yokoyama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 508 days.

(21) Appl. No.: 17/134,881

(22) Filed: Dec. 28, 2020

(65) Prior Publication Data
US 2021/0138590 A1 May 13, 2021

Related U.S. Application Data

(63) Continuation of application No. PCT/JP2020/002752, filed on Jan. 27, 2020.

(30) Foreign Application Priority Data
Jan. 28, 2019 (JP) .................................. 2019-012501

(51) Int. Cl.
*B23K 35/26* (2006.01)
*B23K 1/00* (2006.01)
(Continued)

(52) U.S. Cl.
CPC .......... *B23K 35/262* (2013.01); *B23K 1/0016* (2013.01); *B23K 35/302* (2013.01);
(Continued)

(58) Field of Classification Search
CPC .. B23K 35/262; B23K 1/0016; B23K 35/302; B23K 2101/40; B23K 2103/12;
(Continued)

(56) References Cited

U.S. PATENT DOCUMENTS 4,981,741 A 1/1991 Kawata et al.
2004/0126269 A1 7/2004 Nozawa et al.
(Continued)

FOREIGN PATENT DOCUMENTS

CN 102560576 A 7/2012
DE 603 00 675 T2 4/2006
(Continued)

OTHER PUBLICATIONS

International Search Report dated Apr. 14, 2020, in corresponding International Patent Application No. PCT/JP2020/002752 (2 pages).
(Continued)

*Primary Examiner* — Douglas W Owens (57) ABSTRACT

The present invention provides a highly reliable solder joint, the solder joint including a solder joint layer having a melted solder material containing Sn as a main component and further containing Ag and/or Sb and/or Cu; and a joined body including a Ni—P—Cu plating layer on a surface in contact with the solder joint layer, wherein the Ni—P—Cu plating layer contains Ni as a main component and contains 0.5% by mass or greater and 8% by mass or less of Cu and 3% by mass or greater and 10% by mass or less of P, the Ni—P—Cu plating layer has a microcrystalline layer at an interface with the solder joint layer, and the microcrystalline layer includes a phase containing microcrystals of a NiCuP ternary alloy, a phase containing microcrystals of $(Ni,Cu)_3P$, and a phase containing microcrystals of $Ni_3P$.

10 Claims, 6 Drawing Sheets

(51) Int. Cl.
*B23K 35/30* (2006.01)
*C23C 18/16* (2006.01)
*C23C 18/32* (2006.01)
*B23K 103/12* (2006.01)
*B23K 101/40* (2006.01)

(52) U.S. Cl.
CPC .......... *C23C 18/1637* (2013.01); *C23C 18/32* (2013.01); *B23K 2101/40* (2018.08); *B23K 2103/12* (2018.08)

(58) Field of Classification Search
CPC .............. B23K 35/001; B23K 2101/34; B23K 2101/42; B23K 2103/172; B23K 1/19; B23K 1/20; C23C 18/1637; C23C 18/32; H01L 23/053; H01L 23/24; H01L 23/36; H01L 23/49582; H01L 23/3735; H01L 24/05; H01L 24/33; H01L 2224/04026; H01L 2224/05639; H01L 2224/05644; H01L 24/13; H01L 24/16; H01L 24/29; H01L 24/32; H01L 2224/13111; H01L 2224/13294; H01L 2224/16503; H01L 2224/29111; H01L 2224/29294; H01L 2224/32227; H01L 2224/32245; H01L 2224/33181; H01L 2224/81048; H01L 2224/81065; H01L 2224/81075; H01L 2224/81211; H01L 2224/8181; H01L 2224/81815; H01L 2224/81948; H01L 2224/83048; H01L 2224/83065; H01L 2224/83075; H01L 2224/83211; H01L 2224/8381; H01L 2224/83815; H01L 2224/83948; H01L 2924/181; H01L 2924/351; H01L 24/81; H01L 24/83; H01L 2224/32503; H01L 2224/81455; H01L 2224/32225; H01L 2224/48091; H01L 2224/83455; H01L 2924/15724; H01L 2924/15747; H01L 2924/19107; H01L 2924/3651; C22C 13/00; C22C 13/02; C22C 19/03
See application file for complete search history.

(56) References Cited

U.S. PATENT DOCUMENTS

2005/0161829 A1* 7/2005 Zeng ...................... H01L 24/10
257/772
2015/0314396 A1 11/2015 Watanabe et al.

FOREIGN PATENT DOCUMENTS

| JP | 63145738 A | 6/1988 |
| JP | 2000226274 A | 8/2000 |
| JP | 2001313454 A | 11/2001 |
| JP | 2005116702 A | 4/2005 |
| JP | 2016128191 A | 7/2016 |

OTHER PUBLICATIONS

Written Opinion of the International Searching Authority dated Apr. 14, 2020, in corresponding International Patent Application No. PCT/JP2020/002752 (3 pages).

German Office Action issued in German Application No. 11 2020 000056.7 dated Nov. 23, 2023.

* cited by examiner

SOLDER JOINT

CROSS-REFERENCE TO RELATED APPLICATIONS

This application is a Continuation Application which claims the benefit under 35 U.S.C. § 111 of International Patent Application No. PCT/JP2020/002752 filed on Jan. 27, 2020, which claims foreign priority benefit under 35 U.S.C. § 119 of Japanese Patent Application No. 2019-012501 filed on Jan. 28, 2019, in the Japanese Intellectual Property Office, the contents of all of which are incorporated herein by reference.

TECHNICAL FIELD

The present invention relates to a solder joint. The present invention particularly relates to a highly reliable solder joint which is preferably used for a joint in a semiconductor device.

BACKGROUND ART

In recent years, as a solder material applied to a semiconductor device such as an IGBT module (power module), Sn—Ag based Pb-free solder is often used among the currently known lead-free solders of various compositions, because it has a relatively good balance in terms of features including, in particular, joinability such as solder wettability, mechanical properties, heat transfer resistance, etc., and has a proven track record in products.

There is an even higher level of demand in the market for energy conservation and efficient use of energy. For example, vehicle-mounted power modules and the like are required to be smaller in size and lighter in weight. Furthermore, there is an increasing demand for reliability such as constant operation at high temperature because the temperature in the vicinity of the chip increases along with an increase in the output power density (higher current), and it is also used even at a high temperature exceeding 100° C. In addition, there is a demand for a longer service life in a corrosive gas environment due to an increase in product safety and safety awareness.

The structure of a semiconductor device is known in which a lead frame serving as a wiring member and also as a heat spreader is soldered to the upper surface electrode of a semiconductor element (IGBT: Insulated Gate Bipolar Transistor) mounted by soldering on an insulating substrate and the concentration of heat generation density is prevented by releasing the heat generated by the semiconductor device to the lead frame (for example, see Patent Document 1).

A copper member having high thermal conductivity is used as a conductive member that constitutes the semiconductor device. Such a copper member having a nickel-phosphorus plating layer formed on the surface thereof has been used from the viewpoint of corrosion resistance. In addition, a wiring board having an electroless nickel-copper-phosphorus plating film formed on a solder joint is also known (for example, see Patent Document 2).

REFERENCE DOCUMENT LIST

Patent Documents

Patent Document 1: JP 2005-116702 A
Patent Document 2: JP 2001-313454 A

SUMMARY OF THE INVENTION

Problem to be Solved by the Invention

A MOS (Metal Oxide Semiconductor) type or IGBT type element, which is called a power semiconductor, is self-heated during operation and reaches a high temperature. The element that repeats heat generation and cooling is joined by solder, but the repeated heat generation of the element causes the solder portion to be repeatedly strained and deteriorated. It is preferable to use a solder alloy having a high heat dissipation property for joining the semiconductor elements that operate at a high temperature. Particularly in semiconductors that generate heat, copper (Cu) is often employed as an electrical connection material in order to reduce loss due to thermal resistance. For example, a Cu plate for a DCB (Direct Copper Bonding) substrate is known.

Meanwhile, sulfur (S) is present on the order of tens of ppb as sulfide gas or the like even in the general environment, and it is present on the order of tens to hundreds of ppm in environments handling water and sewerage, corrugated cardboard, or the like. This causes Cu to corrode, causing Cu ions to move over the insulator between adjacent electrodes. As a result, the dielectric strength between the electrodes is reduced, and there is a problem of migration that shorts the electrodes. There is also the aspect that Cu discolors and blackens when corrosive substances are generated by sulfide gas, which is not preferred by users in terms of product appearance.

It is said that there are two factors for migration, and the migration occurs due to multiple factors in semiconductor products that handle high power. The semiconductor device may be used in a high temperature and high humidity environment. For example, migration occurs due to sulfide gas corrosion between the electrodes of the module, resulting in a short circuit between the electrodes. For this reason, the adoption of Ni, which is less likely to cause migration than Cu, has been studied. To form the Ni layer, electroless nickel-phosphorus (Ni—P) plating having a P concentration of 22 to 12% is used in terms of mass productivity, homogeneity, and corrosion resistance.

Against this background, for example, when joining a semiconductor element and a Ni—P plated copper substrate, an increasing number of products are joined by a Sn—Sb—Ag based solder and a Ni—P plating layer, which are reliable at high temperatures. Here, Ni of the plating layer elutes into the solder that is the joint body during melting of the solder (at the time of joining), and a brittle P-enriched phase (P-enriched layer) is generated at the interface between the solder and the Ni—P plating layer. Since the P-enriched layer contains many defects, such as holes, and is fragile, the phenomenon of peeling at the interface between the solder layer and the NiP layer may occur, which may reduce the reliability of the joint body. The P-enriched phase is generated at the time of joining. In a product operating at high temperature, the P-enriched layer grows due to heat and the brittle layer expands. In addition, the number of defects is increased and reliability is decreased.

Figure 8:
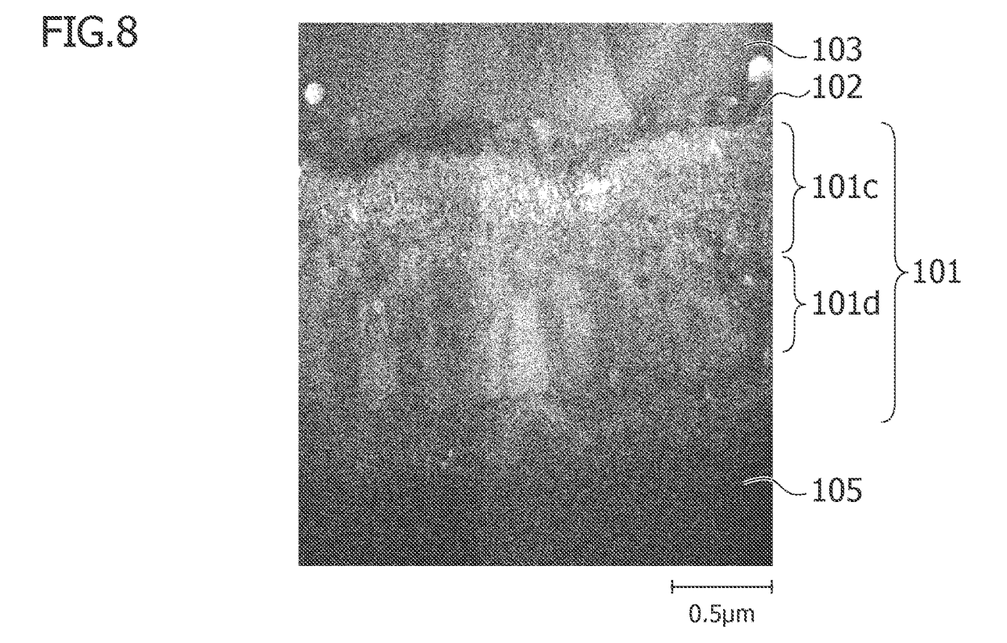
FIG. 8 is a transmission micrograph of a cross section of the solder joint of Comparative Example 4.

In particular, for a power module or the like, a joining process having a high solder melting temperature and a long joining time is used because members having a large heat capacity are to be joined. As in the photograph in FIG. 8, when a Ni-8% P plating layer with a film thickness of 5 μm is joined to the Sn—Sb based solder material, there is a problem that Ni elutes into the solder, and holes (defects) having a diameter of 0.1 μm or greater are generated in the Ni—P plating layer. If a plating thickness is set to, for example, 10 μm or greater in order to adjust the joining time and the Ni elution amount, it is possible to prevent Ni from eluting and forming a compound with Sn during the joining, and to also cause the Ni—P plating layer to remain. However, since holes (defects) are generated in the eluted portion, the reliability is low. The photograph in FIG. 8 is an example of solder joining by holding at 300° C. for 1.5 minutes or more. Here, it was found from a transmission electron microscope (TEM) image that the plated film was crystallized in a columnar shape. Therefore, it is considered that Ni is likely to easily elute. In addition, the solder joint generates heat due to current application for driving the product, and the heat generation causes thermal diffusion. Therefore, for example, the crystals of the intermetallic compounds formed between the solder and the joined body may grow and become coarse, columnar, or increased in layer thickness. The change in the interface between different materials due to the thermal diffusion may improve the joining strength. However, if there is excessive diffusion and the crystal grains have a size of 100 nm or more, it is considered that deterioration, such as a decrease in strength, may occur. In particular, it is considered that columnar crystals having a large specific surface area may also be easily diffused in thermal diffusion.

The present inventors have earnestly researched and found as a result that a highly reliable joint can be formed in the case of using a joined body including a layer of Ni—P—Cu plating with a specific composition instead of Ni—P plating and forming a joint layer on the surface in contact with a solder material in combination with the solder material having a specific composition. Thus, the present invention has been completed.

[1] According to an embodiment, the present invention relates to a solder joint including a solder joint layer having a melted solder material containing Sn as a main component and further containing Ag and/or Sb and/or Cu; and a joined body including a Ni—P—Cu plating layer on a surface in contact with the solder joint layer, in which the Ni—P—Cu plating layer contains Ni as a main component and contains 0.5% by mass or greater and 8% by mass or less of Cu and 3% by mass or greater and 10% by mass or less of P, the Ni—P—Cu plating layer has a microcrystalline layer at an interface with the solder joint layer, and the microcrystalline layer includes a phase containing microcrystals of a NiCuP ternary alloy, a phase containing microcrystals of $(Ni,Cu)_3P$, and a phase containing microcrystals of $Ni_3P$.

[2] In the solder joint according to [1] described above, preferably, the microcrystals of the NiCuP ternary alloy include microcrystals having an average particle diameter of about 10 nm or less.

[3] In the solder joint according to [1] or [2] described above, preferably, the microcrystalline layer is free of columnar crystals or particles having a major axis of 75 nm or greater.

[4] In the solder joint according to any one of [1] to [3] described above, preferably, the solder material contains Sn, Ag, and Sb.

[5] In the solder joint according to [4] described above, preferably, the solder material further contains Ni and/or Ge and/or Cu.

[6] In the solder joint according to any one of [1] to [5] described above, preferably, the joined body including the Ni—P—Cu plating layer is a member in which an electroless Ni—P—Cu plating layer is provided on a base material containing Cu, Al, or a Cu alloy as a main component.

[7] According to another embodiment, the present invention relates to an electronic device including the solder joint according to any one of [1] to [5] described above.

[8] According to yet another embodiment, the present invention relates to a semiconductor device including the solder joint according to any one of [1] to [5] described above.

[9] In the semiconductor device according to [8] described above, preferably, the solder joint is a joint between a substrate electrode, a lead frame, or an implant pin and a semiconductor element, a joint between a conductive plate and a heat sink, and/or a joint between terminals.

[10] In the semiconductor device according to [9] described above, preferably, the semiconductor element is a Si semiconductor element or a SiC semiconductor element.

Effects of the Invention

In the solder joint according to the present invention, conventional defects generated with time in the joint are very unlikely to occur, so that the product life is improved. For this reason, it can be suitably used for demand-increasing electronic devices with large current specifications, and in particular, can be suitably used for a wide variety of semiconductor device applications such as joining of terminals and joining of other members of semiconductor devices.

MODE FOR CARRYING OUT THE INVENTION

Embodiments of the present invention are described later with reference to the drawings. However, the present invention is not limited to the embodiments described later. Throughout the specification, when assuming that A, B, C, and D are metal elements and that a and b are integers, the intermetallic compound specified by $(A,B)_a(C,D)_b$ refers to a form in which multiple intermetallic compounds are mixed, including compounds $A_aC_b$ in which some of the A are replaced by B and some of the C are replaced by D. In addition, in this case, the abundance ratio of the element A written earlier in the parentheses is higher than the abundance ratio of B written later, and similarly, the abundance ratio of C is higher than the abundance ratio of D. In addition, in the present specification, the solder joint layer refers to one in which the solder material is melted and joined to a joined body. In addition, the solder joint refers to a concept including a solder joint layer and a joined body. The joined body refers to a member that is in contact with the surface of each solder joint layer and joined by the solder joint layer.

First Embodiment: Solder Joint

According to the first embodiment, the present invention is a solder joint including a solder joint layer having a melted solder material containing Sn as a main component and further containing Ag or Sb; and a joined body including a Ni—P—Cu plating layer on a surface in contact with the solder joint layer. The joint is such that the Ni—P—Cu plating layer has a microcrystalline layer at an interface with the solder joint layer, and the microcrystalline layer includes a phase containing microcrystals of a NiCuP ternary alloy, a phase containing microcrystals of $(Ni,Cu)_3P$, and a phase containing microcrystals of $Ni_3P$.

(Joined Body)

The joined body constituting the joint according to the present embodiment is a member including a Ni—P—Cu plating layer on the surface in contact with the solder joint layer. The member including the Ni—P—Cu plating layer may be a member in which the Ni—P—Cu plating layer is formed on a conductive member. Examples of the conductive member include, but are not limited to, members containing Cu, Al, or a Cu alloy (for example, Cu—Sn alloy or Cu—Zn alloy) as a main component.

The Ni—P—Cu plating layer is an electroless plating layer containing Ni as a main component and P and Cu in a predetermined amount. The content of Cu in the Ni—P—Cu plating layer is 0.5% by mass or greater and 8% by mass or less. When the content is less than 0.5% by mass, the amount of substitution of Cu that suppresses the diffusion of Ni is insufficient, and it is impossible to obtain the effect of suppressing thermal diffusion due to heat generation during solder joining and during product use. When the Cu content is greater than 8% by mass, because Cu is more easily oxidized than Ni, the solder joinability is deteriorated and the corrosion resistance against corrosive gas is deteriorated. The content of Cu is preferably 2.0% by mass or greater and 4% by mass or less. In solder joining with heat generation, good solder joinability (wettability) is also an important characteristic. Considering that the solder wettability does not decrease and the oxidation and corrosion performance does not decrease, the abovementioned addition amount of Cu is desirable as a range in which other characteristics are not deteriorated under the condition that fine crystals of the NiCuP ternary alloy described later are formed.

The content of P in the Ni—P—Cu plating layer is 3% by mass or greater and 10% by mass or less. When the content is less than 3% by mass, a columnar structure of Ni, which may cause defects, is likely to be generated. On the other hand, when the content exceeds 10% by mass, the NiP compound is precipitated to form a crystalline film, and Ni easily elutes in the solder joint layer, which is not preferable. Preferably, the content of P is 4% by mass or greater and 6% by mass or less. In this range, the columnar structure of Ni is unlikely to be formed even when joined to solder, and it is possible to suppress a P-enriched layer and defects described in detail later. In addition, the wettability is also good. In general, Ni plating, which has a low deposition rate of plating, can be plated at a high speed by adding P as a catalyst. More specifically, P enters the Ni film because phosphoric acid is used as a reducing agent when reducing and precipitating Ni. The general Ni—P plating according to conventional techniques forms a plating layer as a mixture of a $Ni_3P$ compound, Ni, and P with the P concentration of about 10% by mass. However, it is said that the $Ni_3P$ compound precipitates during plating and reduces wettability. For this reason, in the conventional general Ni—P plating used as a surface treatment material for solder joining, the P concentration is usually set 6 to 8% by mass so that the $Ni_3P$ compound does not precipitate during plating. However, in the present embodiment, when used in combination with a solder material described in detail later, the wettability is improved if the P concentration is 8% by mass or less, and the wettability can be further improved if it is 6% by mass or less.

The balance of the Ni—P—Cu plating layer is substantially Ni. When Ni is the main component and Cu and P are contained in the abovementioned predetermined amounts, the Ni—P—Cu plating layer reacts with Sn contained in the solder material on formation of the solder joint layer, and it is possible to suppress the generation of the NiSn compound to be generated. That is, Ni in the plating layer excessively reacts with Sn in the solder material, so that Ni in the plating layer elutes. This can prevent formation of a layer having a low Ni concentration, in other words, a layer having a high P concentration. As a result, holes (defects) can be reduced. Note that the Ni—P—Cu plating layer might contain Fe, Au, Ag, Pd, Bi, Pb, and In elements in addition to Ni, P, and Cu as inevitable impurities derived from additives such as catalyst metal salts. Note that, in the composition range of the present invention, the Ni—P—Cu plating layer is in a non-crystalline state, and even when X-ray diffraction analysis is performed, there is no peak of an alloy such as $Ni_3P$ and the waveform is broad.

The thickness of the Ni—P—Cu plating layer is not particularly limited, but may be, for example, about 1 to 10 µm, and preferably about 2 to 5 µm.

The plating base material on which the Ni—P—Cu plating layer is formed may be any conductive member and is not particularly limited. Typically, it may be a member containing Cu, Al, or a Cu alloy such as Cu—Sn or Cu—Zn as a main component. In addition, the plating base material may include a Ni—P—Cu plating layer on the joint surface. The shape thereof is not particularly limited.

The method of forming a Ni—P—Cu plating layer on the base material is not particularly limited, and a general electroless plating method can be used. The composition of the plating bath capable of forming the Ni—P—Cu plating layer is not particularly limited, and it is possible to use a common plating bath composition including nickel salt, copper salt, hypophosphite, and complexing agent. More specifically, it is possible to use a plating bath containing nickel sulfate, copper sulfate, sodium hypophosphite, and sodium citrate and capable of forming a plated film having a composition in the desired range of the present invention. In addition, as the pretreatment of the plating base material, an acid treatment, a zincate treatment (zinc deposition), or a treatment of attaching a catalyst such as Pd or Pt may be used.

When the solder joint layer is located between two or more joined bodies to join the two or more joined bodies and thereby forms a joint, at least one of the joined bodies may be a joined body including a Ni—P—Cu plating layer. The other joined body may be a joined body including a Ni—P—Cu plating layer, or may be another joined body. As other joined bodies, a member is appropriately selected that is suitable for the purpose of the product including a joint and that is not destroyed by the heat generated by the product and the thermal stress caused thereby, and examples include, but are not limited to, Cu, Ni, Ag, Au, alloys containing these, and the like.

Solder Material

In the solder joint of the present embodiment, as a solder material which is melted to form a solder joint layer, it is possible to use a solder material containing Sn as a main component and also containing Ag and/or Sb and/or Cu. In addition to these components, it is preferable to use a solder material containing one or more components selected from Ni, Ge, Si, V, P, Bi, Au, Pb, Al, and C. In a solder material called "lead-free solder", which has Pb in an amount of 500 ppm or less and Sn as a main component, there are many components such as binary eutectic materials and ternary eutectic materials such as Sn—Ag, Sn—Ag—Cu, Sn—Sb, and Sn—Sb—Ag. There are precipitation-strengthened Sn—Ag based materials that increase the material strength with precipitates for Sn, and solid-solution-strengthened materials that increase the material strength with Sb, Bi, or the like that form a solid solution in Sn. In all cases, there is an element that strengthens in a physical shape, and an element that can form a solid solution in Sn and strengthen as a crystal structure. There is also a combination in which each of them can be combined to strengthen precipitation and solid solution. The elements added to Sn can be expected to have the effects of densifying the solidified structure and suppressing thermal deformation of the structure due to thermal diffusion. Solder materials useful in the present invention are, for example, Sn—Ag, Sn—Sb, Sn—Ag—Sb, Sn—Ag—Cu, Sn—Sb—Ag—Ni, Sn—Sb—Ag—Cu, Sn—Sb—Ag—Ni—Ge, Sn—Sb—Ag—Ni—Cu—Ge, Sn—Ag—Cu—Ni, Sn—Ag—Cu—Ge, and Sn—Ag—Cu—Ni—Ge solders. Note that, in the present specification, the expression "E-F-G solder" in which E, F, and G are each an element, means a solder material that contains E, F, and G and may contain inevitable impurities, and the composition ratio of elements is not particularly limited. Hereinafter, aspects of the solder material which can be used preferably are described more specifically.

First Aspect: Sn—Ag—Sb

For the Sn—Ag—Sb solder material according to the first aspect, an alloy containing Sb in an amount of greater than 5.0% by mass and 10.0% by mass or less and Ag in an amount of 2.0% by mass to 4.0% by mass, and the balance composed of Sn and inevitable impurities, can be preferably used. The inevitable impurities mainly refer to Cu, Ni, Zn, Fe, Al, As, Cd, Au, In, P, Pb, and the like. The solder material according to the present invention is a lead-free solder alloy having Pb in an amount of 500 ppm or less. When the solder material containing Sn as a main component contains Ag and Sb in the above composition range, it is possible to secure the wettability of the solder material and suppress the decrease in thermal conductivity of the alloy even when the temperature rises. More preferably, the Sn—Ag—Sb solder material contains Sb in an amount of 6.0% by mass to 8.0% by mass and Ag in an amount of 3.0% by mass to 4.0% by mass, and the balance is composed of Sn and inevitable impurities. With such a composition range, in addition to the abovementioned advantages, the thermal conductivity of the alloy can be increased as the temperature rises. Note that Ag does not easily react with Ni, Cu, and P, and does not form a compound at the interface between the Ni—Cu—P plating layer and the solder layer, and thus has the effect of improving the strength of the solder material itself with an alloy such as Ag$_3$Sn without causing adverse effects such as a P-enriched layer, holes, and coarsening of crystals. The same applies to the following second to sixth aspects.

Second Aspect: Sn—Sb—Ag—Ni

For the Sn—Sb—Ag—Ni solder material according to the second aspect, an alloy containing Sb in an amount of greater than 5.0% by mass and 10.0% by mass or less, Ag in an amount of 2.0% by mass to 4.0% by mass, and Ni in an amount of greater than 0 and 1.0% by mass or less, and the balance composed of Sn and inevitable impurities, can be preferably used. The advantage of further adding Ni to the composition of the first aspect within the abovementioned addition range is that it is possible to affect the thermal diffusion path of the alloy to thereby increase the thermal conductivity of the alloy, as well as to improve the wettability to thereby achieve a low void ratio on formation of a joint layer. Further preferably, Sb is contained in an amount of 6.0% by mass to 8.0% by mass, Ag is contained in an amount of 3.0% by mass to 4.0% by mass, and Ni is contained in an amount of 0.01% by mass to 0.5% by mass, and the balance is composed of Sn and inevitable impurities. With such a composition range, in addition to the above, it is possible to further achieve an advantage that the melting point of the solder material can be reduced to 260° C. or less.

Third Aspect: Sn—Sb—Ag—Cu

For the Sn—Sb—Ag—Cu solder material according to the third aspect, an alloy containing Sb in an amount of greater than 5.0% by mass and 10.0% by mass or less, Ag in an amount of 2.0% by mass to 4.0% by mass, and Cu in an amount of greater than 0 and 1.2% by mass or less, and the balance composed of Sn and inevitable impurities, can be preferably used. The advantage of further adding Cu to the composition of the first embodiment is that it is possible to affect the thermal diffusion path of the alloy to thereby increase the thermal conductivity of the alloy, as well as to improve the wettability to thereby achieve a low void ratio on formation of a joint layer. Further preferably, Sb is contained in an amount of 6.0% by mass to 8.0% by mass, Ag is contained in an amount of 3.0% by mass to 4.0% by mass, and Cu is contained in an amount of 0.1% by mass to 0.9% by mass, and the balance is composed of Sn and inevitable impurities. With such a composition range, in addition to the above, it is possible to further achieve an advantage that the wettability is particularly good.

Fourth Aspect: Sn—Sb—Ag—Ni—Ge

For the Sn—Sb—Ag—Ni—Ge solder material according to the fourth aspect, an alloy containing Sb in an amount of greater than 5.0% by mass and 10.0% by mass or less, Ag in an amount of 2.0% by mass to 4.0% by mass, Ni in an amount of greater than 0 and 1.0% by mass or less, and Ge in an amount of 0.001% by mass to 2.0% by mass, and the balance composed of Sn and inevitable impurities can be preferably used. The advantage of further adding Ge to the composition of the second aspect within the abovementioned addition range is that it is possible to affect the thermal diffusion path of the alloy to thereby increase the thermal conductivity of the alloy, as well as to improve the wettability to thereby achieve a low void ratio on formation of a joint layer. Further preferably, Sb is contained in an amount of 6.0% by mass to 8.0% by mass, Ag is contained in an amount of 3.0% by mass to 4.0% by mass, Ni is contained in an amount of 0.01% by mass to 0.5% by mass, and Ge is contained in an amount of 0.003% by mass to 0.01% by mass, and the balance is composed of Sn and inevitable impurities. With such a composition range, in addition to the above, it is possible to further achieve an advantage that the melting point of the solder material can be reduced to 260° C. or less.

Fifth Aspect: Sn—Sb—Ag—Ni—Cu—Ge

For the Sn—Sb—Ag—Ni—Cu—Ge solder material according to the fifth aspect, an alloy containing Sb in an amount of greater than 5.0% by mass and 10.0% by mass or less, Ag in an amount of 2.0% by mass to 4.0% by mass, Ni in an amount of greater than 0 and 1.0% by mass or less, Cu in an amount of greater than 0 and 1.2% by mass or less, and Ge in an amount of 0.001% by mass to 2.0% by mass, and the balance composed of Sn and inevitable impurities can be preferably used. The advantage of further adding Cu to the composition of the fifth aspect within the above-mentioned addition range is that it is possible to affect the thermal diffusion path of the alloy to thereby increase the thermal conductivity of the alloy, as well as to improve the wettability to thereby achieve a low void ratio on formation of a joint layer. Further preferably, Sb is contained in an amount of 6.0% by mass to 8.0% by mass, Ag is contained in an amount of 3.0% by mass to 4.0% by mass, Ni is contained in an amount of 0.01% by mass to 0.5% by mass, Cu is contained in an amount of 0.1% by mass to 0.9% by mass, and Ge is contained in an amount of 0.003% by mass to 0.01% by mass, and the balance is composed of Sn and inevitable impurities. With such a composition range, in addition to the above, it is possible to further achieve an advantage that the melting point of the solder material can be reduced to 260° C. or less.

Sixth Aspect: Sn—Ag—Cu

For the Sn—Ag—Cu solder material according to the sixth aspect, an alloy containing Ag in an amount of 2.0% by mass to 4.0% by mass and Cu in an amount of 0.1% by mass to 2% by mass, and the balance composed of Sn and inevitable impurities can be preferably used. An advantage of the sixth aspect is that it is possible to lower the melting point of the solder and improve the wettability. Further preferably, Ag is contained in an amount of 3.0% by mass to 4.0% by mass, and Cu is contained in an amount of 0.5% by mass to 0.9% by mass, and the balance is composed of Sn and inevitable impurities. Modified aspects of the present embodiment include Sn—Ag—Cu—Ni solder material, Sn—Ag—Cu—Ge solder material, and Sn—Ag—Cu—Ni—Ge solder material obtained by further adding Ni and/or Ge to the above. In these compositions, in addition to Sn, Ag, and Cu, Ni can be contained in an amount of 0.02% by mass to 0.1% by mass, preferably 0.03% by mass to 0.06% by mass, and/or Ge can be contained in an amount of 0.001% by mass to 2% by mass, preferably 0.003% by mass to 0.01% by mass.

Modified Aspect

As modified aspects, the solder materials according to the first to sixth aspects may be further added with Ge, P, or both of them. This is because Ge can affect the thermal diffusion path of the alloy, and both Ge and P have the effect of suppressing the oxidation of the solder material and can contribute to the improvement of wettability. In this case, the solder material preferably contains Ge in an amount of 0.001% by mass to 2.0% by mass. Alternatively, or in addition to this, P is preferably contained in an amount of 0.001% by mass to 0.1% by mass. When both Ge and P are added, the addition amount can be appropriately selected from the above range. Both Ge and P are more easily oxidized than Sn, and Sn can be prevented from oxidizing in this addition range, and the wettability of the solder material can be secured. The addition of Ge and the suitable addition amount thereof have already been described in the fourth, fifth, and sixth modified aspects, and thus, in these aspects, the amount of Ge can be that described in each aspect. In addition, the compositions obtained by removing Ag from the respective compositions of the solder materials according to the first to sixth aspects and the modified aspects thereof can also be modified aspects.

In the present invention, the solder material according to any of the first to sixth aspects and the modified aspects thereof can be prepared according to a usual method, or can be prepared by melting Sn, Ag, and/or Sb and/or Cu, various raw materials optionally selected from additional elements, or a mother alloy containing various raw materials in an electric furnace. It is preferable to use each raw material having a purity of 99.99% by mass or greater.

In addition, the solder materials according to the first to sixth aspects and the modified aspects thereof can be used as a plate-shaped preform material (plate-shaped solder) or powdered and used as a cream solder together with a flux. When the solder material is processed into a powder and combined with flux to form a cream solder, the particle diameter of the solder powder is preferably in the range of 10 to 100 μm, and more preferably 20 to 50 μm. The average particle diameter can be, for example, 25 to 50 μm when measured using a general laser diffraction/scattering type particle size distribution measuring device. As the flux having, for example, a cleaning action for removing the oxide film, any flux can be used, and in particular, a rosin-based flux can be preferably used.

The thickness, shape, and the like of the solder material used for forming the solder joint layer can be appropriately set by those skilled in the art according to the purpose and application, and they are not particularly limited. As an example, the thickness of the solder joint layer can be about 200 to 300 μm, but it is not limited to this range. To form the joint, a solder material is arranged on the surface of the plated film of the material to be joined, and heated at a predetermined temperature. As a result, Ni or the like forming the plated film is instantaneously (several ms to several tens of ms) diffused in the molten solder layer to form an alloy layer, and is then joined. In the case of the solder materials according to the first to sixth embodiments and the modified aspects thereof, the members to be joined are brought into contact with each other via a solder paste or a solder pellet (plate-shaped solder), and then heat treatment is performed while maintaining the heating peak temperature at a temperature higher by 20 to 50° C. than the liquidus temperature (melting point) of the solder material as the joining temperature, for example at a temperature of 250° C. or higher and 350° C. or lower for about 0.5 minutes to 30 minutes, and preferably about 1 minute to 5 minutes. The joining atmosphere can be a nitrogen atmosphere, or the joining can be performed in an active atmosphere such as hydrogen or formic acid. In particular, when plate-shaped solder is used, it is preferable to use a gas having a reducing effect, such as hydrogen or formic acid. When joining in an active gas atmosphere having these reducing effects, the temperature is preferably such that the gas effectively reduces the oxide, for example, 250 to 280° C. In actual joining, since the joining has a temperature distribution of several ° C. or greater, stable joining quality can be obtained by ensuring a certain temperature and time. Then, the molten solder is solidified by cooling at a predetermined temperature lowering rate to form a solder joint layer. The temperature rising rate of this heat treatment is about 1° C./sec, but the temperature lowering rate is preferably 5° C./sec or greater, and more preferably 8° C./sec or greater and 15° C./sec or less. In the conventional joining method, the temperature lowering rate of the heat treatment for forming the solder joint layer is 1° C./sec, and in this case, the fine crystals in the plating layer are likely to become coarse, and by setting the temperature lowering rate within the above range, it becomes easy to obtain a solder joint layer having a predetermined configuration.

Interface Structure

The joint formed by combining the above-described material to be joined and the solder material and melting the solder material has a microcrystalline layer at the interface of the Ni—P—Cu plating layer with the solder joint layer. FIG. 1 is a conceptual diagram schematically illustrating a solder joint according to the present embodiment, FIG. 1A is a schematic diagram of a solder joint immediately after joining, and FIG. 1B is a schematic diagram of a solder joint after being treated at 175° C. for 250 hours.

Figure 1A:
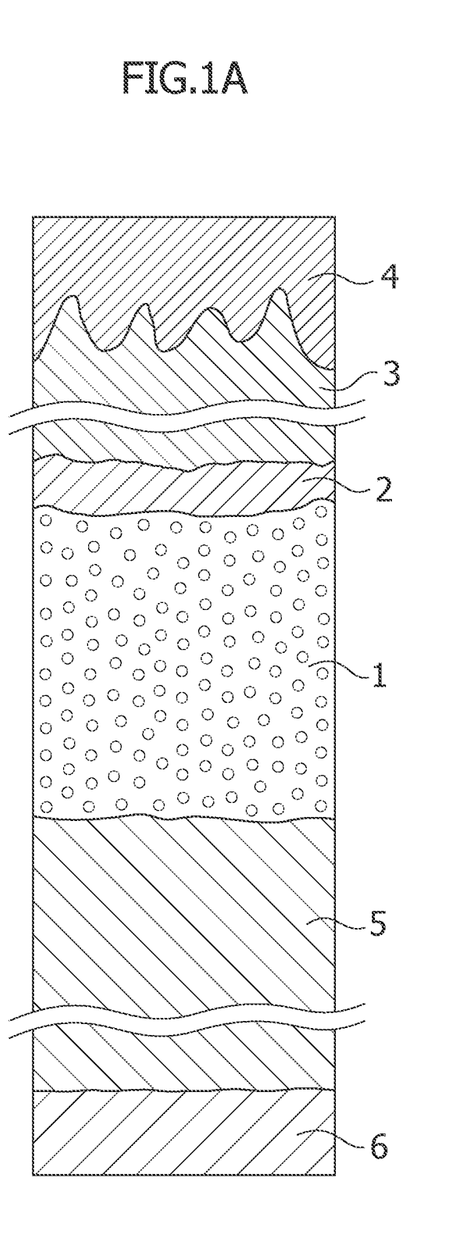
FIGS. 1A and 1B are each a conceptual diagram schematically illustrating a solder joint according to the present invention.
Figure 1B:
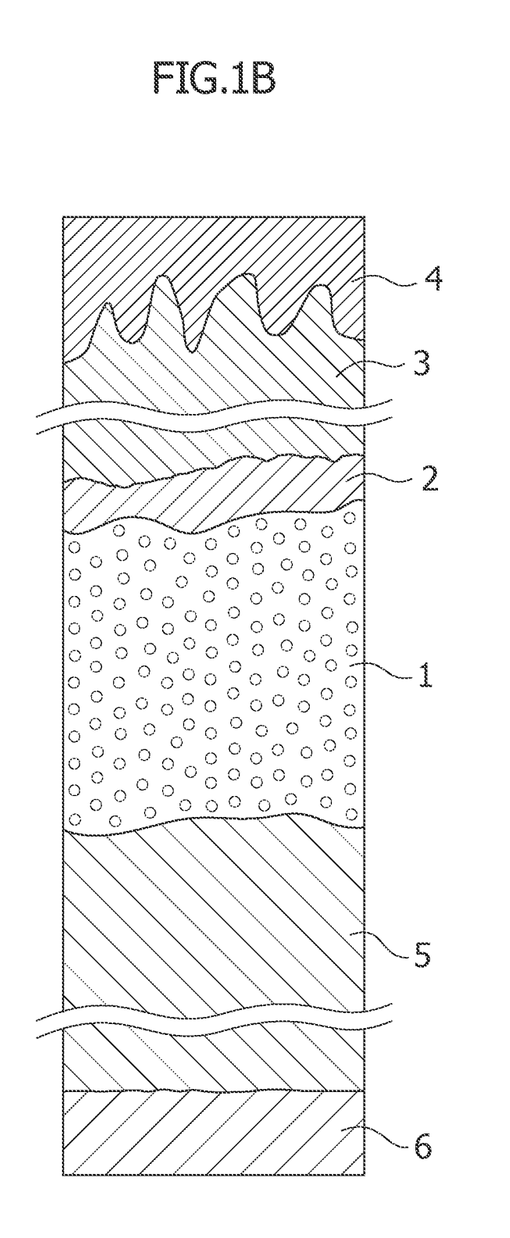

Referring to FIG. 1A, a base material layer 6, a Ni—P—Cu plating layer 5, a microcrystalline layer 1, a first intermetallic compound layer 2, a second intermetallic compound layer 3 layer, and a solder layer 4 are sequentially formed. Among these, the Ni—P—Cu plating layer 5 and the microcrystalline layer 1 are derived from the Ni—P—Cu plating layer of the joined body. The base material layer 6 is a plating base material, and copper, copper alloy, aluminum, aluminum alloy, or the like is used. The first intermetallic compound layer 2 is a layer in which an intermetallic compound of $(Ni,Cu)_3(Sn,Sb)_2$ layer or $Ni_3(Sn,Sb)_2$ is precipitated, and is a layer formed when Ni or Cu eluted from the plating reacts with Sn or the like of the solder material. In addition, the second intermetallic compound layer 3 is a layer in which an intermetallic compound of $(Ni,Cu)_3(Sn,Sb)_4$ layer or $Ni_3(Sn,Sb)_4$ is precipitated, and is a layer formed when Ni or Cu eluted from the plating similarly reacts with Sn or the like of the solder material. The solder layer 4 is derived from the solder material. Note that FIG. 1 is a schematic conceptual diagram, and the thickness of each layer and the relationship between their relative thicknesses do not limit the present invention. In particular, the second intermetallic compound layer 3 and the Ni—P—Cu plating layer 5 have a large thickness as compared with the microcrystalline layer 1, and are therefore illustrated with lines indicating omission. The Ni—P—Cu plating layer 5 is a layer that maintains the initial composition and structure before solder joining. Although not illustrated, a transition layer exists between the microcrystalline layer 1 and the Ni—P—Cu plating layer 5. The transition layer is a layer containing Ni or NiP having atomic defects.

Each layer is described. The base material layer 6 and the Ni—P—Cu plating layer 5 are layers that are derived from the abovementioned joined bodies and are almost unchanged from before the solder material is melted (before the joint layer is formed). These layers can be identified by scanning electron microscope (SEM) cross-sectional photographic observation of solder joints and elemental analysis such as EDX (Energy Dispersive X-ray spectrometry) spot analysis and mapping analysis. Note that the cross section of a solder joint means a cross section perpendicular to the interface between the solder joint layer and the material to be joined.

The microcrystalline layer 1 is a layer formed at the interface of the Ni—P—Cu plating layer with the solder joint layer. Note that the interface of the Ni—P—Cu plating layer with the solder joint layer is the interface between the solder material and the joined body before joining, but in FIG. 1, it is approximately the interface between the microcrystalline layer 1 and the first intermetallic compound layer 2. Specifically, a layer is formed in which elements of the Ni—P—Cu plating layer derived from the solder material and the joined body are mixed, and in FIG. 1, Ni and the like of the Ni—P—Cu plating layer diffuse to form the first intermetallic compound layer 2 and the second intermetallic compound layer 3. The microcrystalline layer 1 is a layer in which crystal grains of an intermetallic compound are scattered in an amorphous layer. The presence of the microcrystalline layer 1 can also be identified by cross-sectional photographic observation of the solder joint with a scanning electron microscope and elemental analysis such as EDX spot analysis and mapping analysis. When analyzed in more detail, the microcrystalline layer 1 include three coexisting phases, (1) a phase containing $(Ni,Cu)_3P$ microcrystals, (2) a phase containing $Ni_3P$ microcrystals, and (3) a phase of NiCuP ternary alloy containing microcrystals other than (1) and (2). FIG. 1 does not specifically illustrate these three phases. These phases can be identified by crystal observation with a transmission electron microscope and elemental analysis. As described above, approximately three phases are formed in the microcrystalline layer 1, and the main compositions of the microcrystals of the respective phases are different. Cu contained in these microcrystalline layers 1 is derived from the Ni—P—Cu plating layer of the joined body. Whether the solder material composition contains Cu or does not contain Cu, the composition of the microcrystalline layer 1 and the amount of the compound are not substantially affected.

(1) The phase containing $(Ni,Cu)_3P$ microcrystals contains microcrystals of the $(Ni,Cu)_3P$ compound, and this $(Ni,Cu)_3P$ compound can be identified by elemental analysis. The particle diameter of crystal grains of the $(Ni,Cu)_3P$ microcrystals is about 5 to 20 nm, and the average particle diameter is about 10 nm or less. The microcrystals of about 10 nm or less can be confirmed by the difference in contrast from an image obtained by observation with a scanning transmission electron microscope (STEM). Although it is possible with a normal transmission electron microscope (TEM), it is effective for confirming crystals at the nano level because STEM images provide higher contrast. The STEM observation is obtained by detecting electrons transmitted through a thin film sample, and all the contrasts obtained by TEM such as scattering absorption contrast, diffraction contrast, and phase contrast can be obtained. These crystal grains can be identified from any of the contrasts. The average particle diameter of the $(Ni,Cu)_3P$ microcrystals refers to the average value obtained by averaging, through image processing, the major axes of $(Ni,Cu)_3P$ microcrystal particles per observation field of 0.36 μm$^2$ when observed with a transmission electron microscope at 80,000 magnification.

(2) The phase containing $Ni_3P$ microcrystals contains microcrystals of the $Ni_3P$ compound. This compound can be identified by elemental analysis. The $Ni_3P$ crystal grains have a particle diameter of about 5 to 20 nm and an average particle diameter of about 10 nm or less. The method of identifying the $Ni_3P$ microcrystals and the method of measuring the average particle diameter of the $Ni_3P$ microcrystals are the same as above.

(3) The phase containing the microcrystals of NiCuP ternary alloy contains $(Ni,Cu)_3P$ and crystal grains mainly composed of a composition other than $Ni_3P$, and specifically contains microcrystals of $(Ni,Cu)_2P_5$, $Ni_2P_5$, $Cu_2P_5$, $(Ni,Cu)_{12}P_5$, $Ni_{12}P_5$, $Cu_{12}P_5$, $(Ni,Cu)_2P$, $Ni_2P$, $Cu_2P$, and $Cu_3P$. This phase contains microcrystals having a crystal particle diameter of about 5 to 20 nm and an average particle diameter of about 10 nm or less. The particles of NiCuP ternary alloy can be identified by STEM observation or TEM observation. In addition, the fact that the microcrystals are the NiCuP ternary alloy can be specified by performing EDX analysis on the TEM observation sample. Note that the average particle diameter of microcrystal particles of the NiCuP ternary alloy refers to the average value obtained by averaging, through image processing, the major axes of microcrystal particles of the NiCuP ternary alloy per observation field of 0.36 µm$^2$ when observed with a transmission electron microscope at 80,000 magnification.

When STEM is used to perform observation at 80,000 magnification for composition analysis of the microcrystals per observation field of 0.09 µm$^2$ (0.3 µm×0.3 µm) and to classify the microcrystals into three phases (1), (2), and (3), the total of (1) the (Ni,Cu)$_3$P microcrystals and (2) the Ni$_3$P microcrystals is 50% or greater and less than 80%. This percentage is the ratio of the sum of the number of microcrystals of (1) and the number of microcrystals of (2) to the total number of microcrystals in the observation field.

In the microcrystalline layer 1, crystals of particles of which a diameter or major axis exceeds 75 nm are generally absent. This can be confirmed by cross-sectional photographic observation of the solder joint with a scanning electron microscope and observation of crystals with a transmission electron microscope. A case is considered in which the Ni—P—Cu plating layer formed on the joined body has a thickness in the range of about 1 to 10 µm, as described above. Regardless of that thickness, the thickness of the microcrystalline layer 1 is about 0.5 to 1.5 µm, and as an example, about 0.8 to 1.2 µm. In the joint according to the present embodiment, the number of holes having a major axis of 10 nm or greater in the microcrystalline layer 1 is 50 or less, and preferably 25 or less, per observation field of the joint cross section. This numerical value is the number obtained when counting the number of holes per observation field of 0.36 µm$^2$ when observing the cross section of the microcrystalline layer 1 at the joint with a transmission microscope at 80,000 magnification.

The size of the microcrystal particles of the NiCuP ternary alloy in the microcrystalline layer 1 differs depending on the Cu concentration in the Ni—P—Cu plating layer formed on the joined body. For example, when the Cu concentration is 0.5% by mass to 1% by mass, the particle diameter is approximately 50 nm or less, and when the Cu concentration is 1% to 3%, uniform crystals having a particle diameter of about 20 nm or less are formed, and crystallization is suppressed, which is preferable. In addition, when the Cu concentration is 3% by mass to 8% by mass, the particle diameter becomes smaller and the structure becomes fine. Note that the diameter mentioned here means the diameter of the microcrystal particle obtained by observing a cross-sectional photograph of the joint by a STEM image. The average particle diameter of fine crystals of 20 nm or less is about 15 nm, and the surface area per unit volume mm$^3$ is 3,540,000 mm$^2$. On the other hand, when particles of 10 to 200 nm are mixed, the average particle diameter is about 105 nm, and the surface area per unit volume mm$^3$ is 50,571 mm$^2$. Regarding the area of grain boundary diffusion of grains dominant due to mutual diffusion by heat, the distance required for diffusion becomes larger as the crystals are smaller in size, and the amount of diffusion when the same energy is externally applied decreases as the specific surface area increases. Therefore, the holes generated at the interface between the Ni—P plating and the solder joint are suppressed by the structure having fine crystals with a large diffusion distance.

FIG. 1B relates to the solder joint layer after heating, which has been treated at 175° C. for 250 hours. Note that this heat treatment is an accelerated test for evaluating the reliability of semiconductor devices and the like. The solder joint layer according to the present embodiment hardly changes even after heating. In particular, crystal growth in the microcrystalline layer 1, generation of defects, and substantial change in the thickness of the microcrystalline layer 1 are not observed. In addition, also, the first and second intermetallic compound layers 2 and 3 hardly change. Moreover, even after treatment at 175° C. for 3,000 hours, holes of 0.5 µm or greater are not observed per 4.6 µm$^2$ of observation field when observed at 10,000 magnification with a field emission scanning electron microscope (FE-SEM).

When a joint is formed using a joined body including a Ni—P—Cu plating layer having a specific composition according to the present embodiment, in the microcrystalline layer derived from the Ni—P—Cu plating layer of the joined body, the orientation of grain boundaries which may cause large diffusion becomes random due to the presence of microcrystals. As a result, the diffusion directions of Ni are not aligned, and the diffusion speed of Ni toward the solder joint layer becomes slow. Therefore, it is possible to prevent the elution of Ni into the solder joint layer and the accompanying embrittlement and defects at the interface, and it is possible to provide a solder joint with superior long-term reliability.

Figures 3A, 3B:
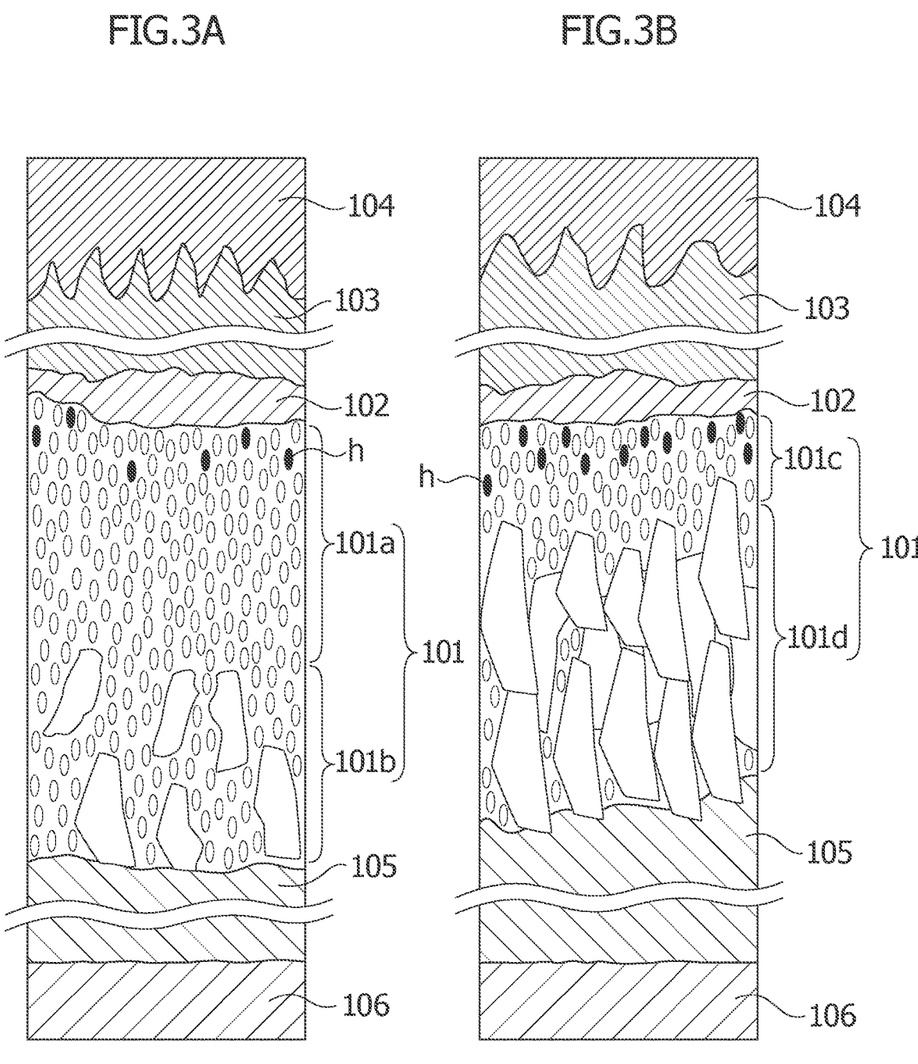
FIGS. 3A and 3B are each a conceptual diagram schematically illustrating a solder joint according to a conventional technique.

FIG. 3 is a conceptual diagram schematically illustrating a solder joint of a conventional technique. The solder joint of the conventional technique contains a solder joint layer having a melted solder material containing Sn as a main component and further containing Ag and/or Sb and/or Cu, and a joined body including a Ni—P plating layer on the surface in contact with the solder joint layer. FIG. 3A is a schematic diagram of the solder joint layer immediately after joining, and FIG. 3B is a schematic diagram of the solder joint layer after being treated at 175° C. for 250 hours. In the solder joint of the conventional technique, the Ni—P plating layer does not include a microcrystalline layer at the interface with the solder joint layer, but includes a phosphorus-enriched layer (P-enriched layer).

Referring to FIG. 3A, a base material layer 106, a Ni—P plating layer 105, a P-enriched layer 101, a Ni$_3$(Sn,Sb)$_2$ layer as a first intermetallic compound layer 102, a Ni$_3$(Sn,Sb)$_4$ layer as a second intermetallic compound layer 103, solder layer 104 are sequentially formed. Among these, the Ni—P plating layer 105 and the P-enriched layer 101 are derived from the Ni—P plating layer of the joined body, and the base material layer 106 is the plating base material. The Ni$_3$(Sn,Sb)$_2$ layer as the first intermetallic compound layer 102 and the Ni$_3$(Sn,Sb)$_4$ layer as the second intermetallic compound layer 103 are layers formed when Ni eluted from the plating reacts with Sn or the like of the solder material, and these and the solder layer 104 are derived from the solder material before joining. Note that FIG. 3 is also a schematic conceptual diagram, and the relative relationship of the thickness of each layer does not limit the present invention. In particular, the second intermetallic compound layer 103 and the Ni—P plating layer 105 have a large thickness as compared with the P-enriched layer 101, and they are therefore illustrated with lines showing omission.

The base material layer 106, the Ni—P plating layer 105, the first intermetallic compound layer 102, the second intermetallic compound layer 103, and the solder layer 104 are also formed in the solder joint of the conventional technique. Since the Ni—P plating layer 105 does not contain Cu, the compositions of the first intermetallic compound layer 102 and the second intermetallic compound layer 103 are different from the compositions of the first intermetallic compound layer 2 and the second intermetallic compound layer 3 according to the embodiment of the present invention illustrated in FIG. 1. The characteristics of the first intermetallic compound layer 2 and the second intermetallic compound layer 3 substituted with Cu according to the embodiment of the present invention are more stable and less likely to grow than those of the first intermetallic compound layer 102 and the second intermetallic compound layer 103 containing no Cu.

Figure 5:
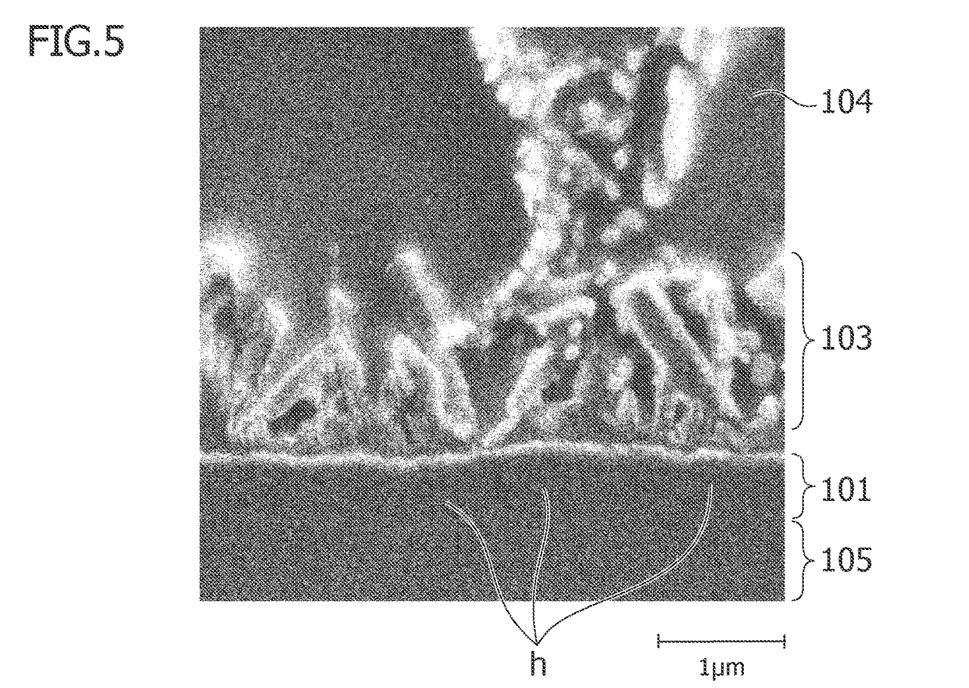
FIG. 5 is a cross-sectional photograph of a solder joint of Comparative Example 4 taken with a scanning electron microscope.

The morphology of the P-enriched layer 101 is significantly different from the microcrystalline layer 1 according to the embodiment of the present invention illustrated in FIG. 1. Referring to FIG. 3A, in the joint at the initial stage of joining, the P-enriched layer 101a near the interface with the first intermetallic compound layer 102 is a density-reduced (coarsened) layer where many holes h due to the diffusion of Ni to the solder side are present. Note that, as illustrated in FIG. 5, observation of the holes h of the P-enriched layer 101a with a scanning electron microscope reveals that the holes h are recessed and appear black. In addition, as illustrated in FIG. 8, continuous holes are seen as white portions in the observation with a transmission electron microscope. In FIG. 3, the holes h are schematically represented by ellipses filled with black. In addition, the P-enriched layer 101a contains Ni particles containing P in the form of slightly columnar crystals represented by multiple white ellipses in FIG. 3. Here, the form of slightly columnar crystals refers to particles having a substantially elliptical cross section, and in the aspect illustrated in FIG. 3, it can be said that the particles have an elliptical cross section of which the major axis is oriented substantially perpendicular to each layer. Coarse columnar crystals of Ni containing P are present in the P-enriched layer 101b near the interface with the Ni—P plating layer 105. The major axis of these columnar crystals is approximately 75 nm to 200 nm, and is generated with the vicinity of the interface with the Ni—P plating layer 105 as the base end. Although not shown, a transition layer, which is a layer containing Ni or NiP having atomic defects, exists near the P-enriched layer 101b and the Ni—P plating layer 105, and the P-enriched layer 101a near the interface with the first intermetallic compound layer 102, the P-enriched layer 101b near the interface with the Ni—P plating layer 105, and the transition layer are collectively referred to as the P-enriched layer 101.

Referring to FIG. 3B schematically illustrating the joint after heating, the base material layer 106, the Ni—P plating layer 105, the first intermetallic compound layer 102, the second intermetallic compound layer 103, and the solder layer 104 do not change much from the initial stage of joining. However, in the P-enriched layer 101c near the interface with the first intermetallic compound layer 102, the low-density region is increased and the coarsening has progressed (details of the coarsening are not shown) compared with the P-enriched layer 101a at the initial stage of joining. In addition, in the P-enriched layer 101d near the interface with the Ni—P plating layer 105, crystallization progresses and columnar crystals develop, and the major axis of the columnar crystals coarsens from about 75 nm to about 500 nm.

In Ni—P plating, the grain boundaries with large diffusion are aligned due to columnar crystallization near the interface. It is presumed that this maximizes the diffusion direction in the vertical direction, increases the diffusion rate of Ni in the solder direction, and forms a low-density region that appears white when observed with a scanning electron microscope. Since these columnar crystals are particularly sensitive to shearing force, it is considered that embrittlement progresses in the vicinity of the interface between the first intermetallic compound layer 102 and the Ni—P plating layer 105.

Many holes are seen in the P-enriched layer 101 illustrated in FIG. 3, but almost no holes are observed in the microcrystalline layer 1 of the present invention illustrated in FIG. 1. Specifically, with respect to the solder joint heat-treated at 175° C. for 250 hours, the P-enriched layer of the Ni—P plating layer and the microcrystalline layer of the Ni—P—Cu plating layer were compared in terms of the number of holes of 10 nm or larger generated in an observation field of 0.36 µm$^2$ when observed with a transmission electron microscope at 80,000 magnification, and it was confirmed that the number of holes generated in the Ni—P—Cu plating layer was suppressed to about ⅕ as compared with the Ni—P plating layer. That is, although there may be minute holes that can be observed by TEM at the interface, the minute holes do not increase in number but are suppressed even after heat treatment in the Ni—Cu—P plating layer of the present invention. Furthermore, after treatment at 175° C. for 3,000 hours, observation with FE-SEM at 10,000 magnification shows that about 5 to 20 holes of 0.5 µm or larger are observed per observation field of 4.6 µm$^2$.

Next, a method of producing the solder joint according to the first embodiment is described. The method for producing a solder joint according to the first embodiment includes a first step of preparing a joined body by subjecting a base material metal to Ni—P—Cu electroless plating, a second step of bringing a solder material into contact with a plated surface of the joined body, and a third step of heating the joined body and the solder material. In the first step, the Ni—P—Cu electroless plated film containing P and Cu in the base material metal is formed at the predetermined concentration described in the present embodiment by the method described in detail above. This makes it possible to prepare the joined body. Next, in the second step, a solder material is brought into contact with the plated surface of the joined body. The composition and form of the solder material may be any of the forms detailed above, and may be plate-shaped solder or cream solder. In the subsequent third step, the joined body and the solder material are heated in a predetermined atmosphere and temperature profile to melt the solder material and form a solder joint layer.

Second Embodiment: Electronic Device

The solder joint according to the first embodiment constitutes a part of an electronic device, and examples of the electronic device include, but are not limited to, electric power devices such as an inverter, a mega solar, a fuel cell, an elevator, a cooling device, and a vehicle-mounted semiconductor device. Typically, the electronic device is a semiconductor device. The joint in the semiconductor device may be a die bond joint, a joint between a conductive plate and a heat sink, a joint between terminals, a joint between a terminal and another member, or any other joint, but is not limited to these. Hereinafter, a semiconductor device is described as an example of an electronic device including the joint according to the present embodiment, and the present invention is described in more detail with reference to the drawings.

Third Embodiment: Semiconductor Device

According to a third embodiment, the present invention relates to a semiconductor device, the semiconductor device including the joint according to the first embodiment.

Figure 2:
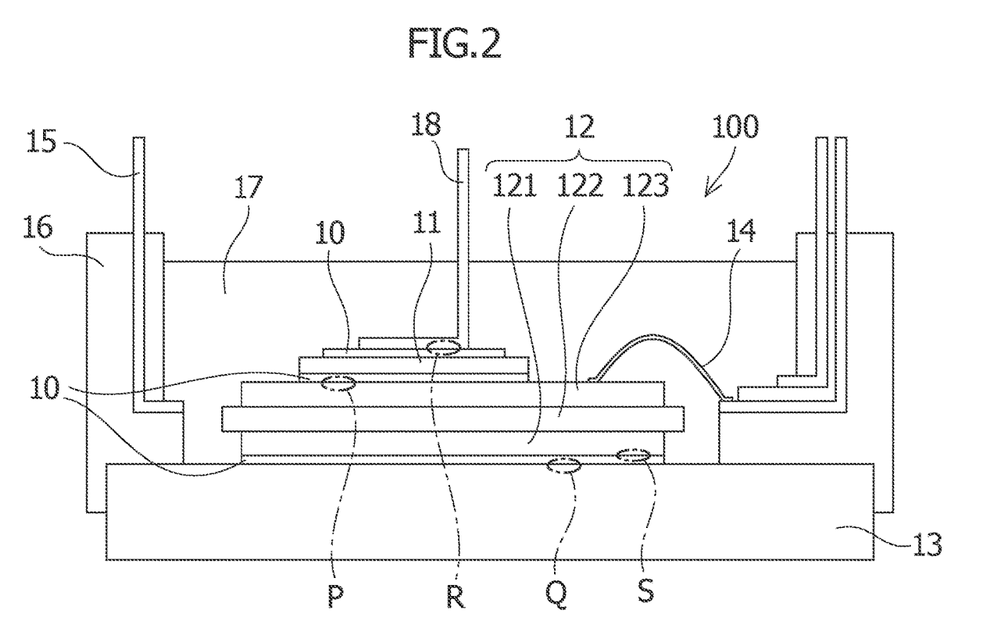
FIG. 2 is a conceptual diagram schematically illustrating an example of a semiconductor device including the solder joint according to the present invention.

FIG. 1 illustrates a conceptual cross-sectional diagram of a power module, which is an example of a semiconductor device. The power module 100 mainly has a laminated structure in which the laminate substrate 12 is joined on the heat sink 13 with the solder joint layer 10 and the semiconductor element 11 is joined on the laminate substrate 12 with the solder joint layer 10. A lead frame 18 is joined to the main surface of the semiconductor element 11 opposite to the laminate substrate 12 with the solder joint layer 10. A case 16 containing an external terminal 15 is attached to the heat sink 13, and the electrode of the laminate substrate 12 and the external terminal 15 are connected via an aluminum wire 14. The inside of the module is filled with the resin sealing material 17. The semiconductor element 11 may be a Si semiconductor element or a SiC semiconductor element, but it is not limited to these. For example, in the case of these elements mounted on an IGBT module, the backside electrode joined to the laminate substrate 12 is usually composed of Au or Ag. In the laminate substrate 12, for example, conductive plates 121 and 123 made of copper or aluminum are provided on the front and back sides of a ceramic insulating layer 122 made of alumina, SiN, or the like. As the heat sink 13, a metal having excellent thermal conductivity such as copper or aluminum is used.

In the illustrated power module 100, the members to be joined having a Ni—P—Cu plating layer joinable to the solder joining layer 10 include the conductive plates 121 and 123 on the upper and lower surfaces constituting the laminate substrate 12, the heat sink 13, and the lead frame 18. As these members to be joined, it is possible to use those having the Ni—P—Cu plating layer described in detail in the first embodiment on the surface in contact with the solder joint layer 10.

Then, in the power module 100 illustrated in FIG. 2, in particular, the joint P of the Cu-made conductive plate 123 forming the Ni—P—Cu plating layer with the solder joint layer 10, the joint Q of the Cu radiator 13 forming the Ni—P—Cu plating layer with the solder joint layer 10, the joint R with the lead frame 18 forming the Ni—P—Cu plating layer with the solder joint layer 10, and the joint S of the Cu-made conductive plate 121 forming the Ni—P—Cu plating layer with the solder joint layer 10 correspond to the solder joint according to the first embodiment.

Note that the semiconductor device illustrated in the present embodiment is an example, and the semiconductor device according to the present invention is not limited to the one having the illustrated device configuration. For example, in the semiconductor device configuration including the lead frame disclosed in Patent Document 1 by the present applicant it is also possible to form a lead frame Ni—P—Cu plating layer and use the solder material having the predetermined composition described in detail above, thereby forming the joint of the present invention. Alternatively, in a semiconductor device having the configuration disclosed in Japanese Patent Application Publication No. 2012-191010 by the present applicant, when joining the insulating substrate and the semiconductor element and joining the implant pin and the semiconductor element, it is possible to form a Ni—P—Cu plating layer on the surface of the conductive plate or the surface of the implant pin provided on one surface of the insulating substrate, and to use a solder material having a predetermined composition, thereby similarly obtaining a semiconductor device having the joint according to the present invention. Additionally, it is possible to form a Ni—P—Cu plating layer on the surface in contact with the member to be joined in the case of performing joining by use of a solder ball, for example, a BGA (Ball Grid Array) or CSP (Chip Size Package) solder ball. These semiconductor devices have an operating temperature of 100 to 250° C. in use conditions.

EXAMPLES

Solder joints were produced, and the characteristics and joinability of the plated film were evaluated. The joinability was evaluated by observing defects and the wettability of the joint and the interface with the solder. The solder material used was a lead-free solder which had the same composition in all joints of Examples and Comparative Examples and contained 3.5% by mass of Ag, 7.5% by mass of Sb, 0.1% by mass of Ni, 0.01% by mass of Ge, and the balance being Sn and inevitable impurities. As the joined body, a Ni—P—Cu plating layer or a Ni—P plating layer was formed on copper as the plating base material by electroless plating method. Table 1 presents the compositions of the plating layers used.

Production of Plating Layer on Base Material

As a pretreatment, alkaline degreasing process was applied to the Cu plate of the base material at 50° C. for 4 minutes, and the Cu plate was washed with water, acid degreased at 40° C. for 4 minutes, washed with water, and then etched with sodium persulfate at 30° C. for 0.5 minutes, washed with water, and surface-treated with 98% sulfuric acid at 25° C. for 0.5 minutes. Then, the plate was washed with water, activated with hydrochloric acid solution using Pd as a catalyst, subjected to an immersion treatment at 25 to 30° C. for 0.5 minutes, and washed with water, and then subjected to electroless Ni—P—Cu or electroless Ni—P plating having a predetermined composition. The electroless Ni—P—Cu or electroless Ni—P plating was treated with air agitation for a time of forming a thickness of 5 μm at 90° C. After plating, the plate was washed with water and dried with a dryer to finish.

Wettability Evaluation

The evaluation of solder wettability used a sample prepared by plating each of the 30×5×0.3 mm tough pitch copper plates (JIS C1100) with a target value of about 5 μm. The wettability was carried out by referring to the bulk wetting wettability test (JIS Z3198-4:2003) method. Using a solder having the composition described above as a solder material, about 1 kg of a molten solder bath was heated to 280° C., and the sample was immersed in the solder bath at a depth of 3 mm for 20 seconds. The wettability was determined as ○ (superior) if, after immersing the sample, the wet-starting zero crossing time (time until the solder wets the test piece) was within 3 seconds, Δ (satisfactory) in the case of 2 to 3 seconds, and x (inferior) in the case of three or more seconds. A tough pitch copper plate without plating was used as a reference condition for this test, and in that case, the wetting time could be obtained in about 1 second.

Production of Solder Joint Body

A plating layer having each composition was formed at a film thickness of 5 μm on a base material (copper plate) to form a member to be joined, and plate solder having the composition described above was overlaid. The bonding was performed with a joining apparatus using a batch type heating plate, and the atmosphere was depressurized to 20 Pa, replaced with nitrogen, reduced to 50 Pa again, and replaced with hydrogen. Soldering was performed by holding at 300° C. for 2 minutes in the replaced atmosphere. The cooling rate was 1° C./sec. The heat treatment was performed as an accelerated test for evaluating the reliability of the semiconductor device.

Evaluation of Defects in Solder Joints

Regarding the produced solder joints, defects at the initial stage and after the heat treatment were evaluated. The initial stage means a point in time immediately after joining. The heat treatment was allowed to stand in hot air type constant temperature baths at 125° C. and 175° C. The determination time was 250 hours. Note that the heat treatment experiment was carried out up to 500 hours and 1,000 hours. In addition, in a semiconductor device having a joint with x, peeling occurred near the interface between the solder material and the plating layer even in the initial state. Further heat treatment caused the peeling to occur more significantly. Therefore, the condition of x was used as the criterion.

The initial defect and the defect after the heat treatment were determined by observing a cross section by SEM. After performing mechanical mirror polishing or the like on the cross section, the sample was observed with a scanning electron microscope at a magnification of about 5,000 to 20,000 times in the observation field. As for the confirmed defects, about 3 to 10 continuous defects of about 0.1 μm to 1 μm were determined as x, non-continuous scattered defects of about 0.1 μm were determined as Δ, and defects that could hardly be confirmed were determined as ○.

Evaluation Results

When the P concentration of the Ni—P plating layer was as low as less than 3% by mass, the elution ability of Ni into the solder was high, and thus, the plating layer reacted with Sn to become a layer of the $Ni_3Sn_2$ and $Ni_3Sn_4$ compound, resulting in holes at the interface. When the P concentration of the Ni—P plating layer was as high as 8% by mass or greater, an intermetallic compound of $Ni_3P$ is generated in the Ni—P plating layer to suppress Ni elution. This is because the intermetallic compound of $Ni_3P$ crystallizes in the Ni—P plating layer, not in the $Ni_3P$ uniform compound layer. Therefore, it is considered that Ni was eluted from the portion without $Ni_3P$ to the solder joint layer side, and there was a difference in the degree of elution, so that the joining defect was likely to occur.

In addition, in the Ni—P plating layers of Comparative Examples, NiP was non-crystalline regardless of the amount of P added, but crystals were crystallized under the joining conditions of 250° C. or higher for joining with a power module or the like. Then, as the heat treatment time increased, the crystals grew to coarse columnar crystals of 75 nm to several 100 nm. Since the elution amount and diffusion rate of Ni are different between crystals having microcrystal grain boundaries and coarse grain boundaries, Ni is likely to elute in the Ni—P plating having coarse crystals, and joining defects are likely to occur.

Table 1 below presents the evaluation results of the composition of the plating layer, joining defects, and solder wettability.

TABLE 1

| Example/Comparative Example | Cu Concentration in Film (wt %) | P Concentration in Film (wt %) | Initial Joining Defect | Defect After Heat Treatment 125° C. | Defect After Heat Treatment 175° C. | Solder Wettability |
|---|---|---|---|---|---|---|
| Comparative Example 1 | — | 1 | X | X | X | ○ |
| Comparative Example 2 | — | 3 | Δ | Δ | X | ○ |
| Comparative Example 3 | — | 6 | Δ | Δ | X | ○ to Δ |
| Comparative Example 4 | — | 8 | Δ | Δ | Δ | X |
| Comparative Example 5 | — | 10 | X | X | X | X |
| Example 1 | 0.35 | 5 | ○ | ○ | ○ | Δ |
| Example 2 | 0.5 | 5 | ○ | ○ | ○ | Δ |
| Example 3 | 2 | 5 | ○ | ○ | ○ | ○ |
| Example 4 | 4 | 5 | ○ | ○ | ○ | ○ |
| Example 5 | 5 | 5 | ○ | ○ | ○ | Δ |
| Example 6 | 7 | 5 | ○ | ○ | ○ | Δ |
| Example 7 | 0.5 | 8 | ○ | ○ | ○ | ○ |
| Example 8 | 2 | 8 | ○ | ○ | ○ | ○ |
| Example 9 | 4 | 8 | ○ | ○ | ○ | ○ |
| Example 10 | 7 | 8 | Δ | Δ | Δ | ○ |
| Example 11 | 0.5 | 3 | Δ | Δ | Δ | ○ |
| Example 12 | 2 | 3 | Δ | Δ | Δ | ○ |
| Example 13 | 4 | 3 | Δ | Δ | Δ | ○ |
| Example 14 | 7 | 3 | Δ | Δ | Δ | ○ |
| Comparative Example 6 | 4 | 1 | X | X | X | X |
| Comparative Example 7 | 4 | 10 | X | X | X | ○ |

For the ones subjected to heat treatment experiment of 500 hours and 1,000 hours, it was confirmed that in the joints of Comparative Examples having defects in the initial joining, the defects were increased as the temperature was higher and the time was longer, and those having a large progress were connected like peeling. On the other hand, in the joints of Examples 8 to 9, no defect or peeling was observed even after the heat treatment at 175° C. for 1000 hours.

Cross-Section Observation Photograph

Figure 4:
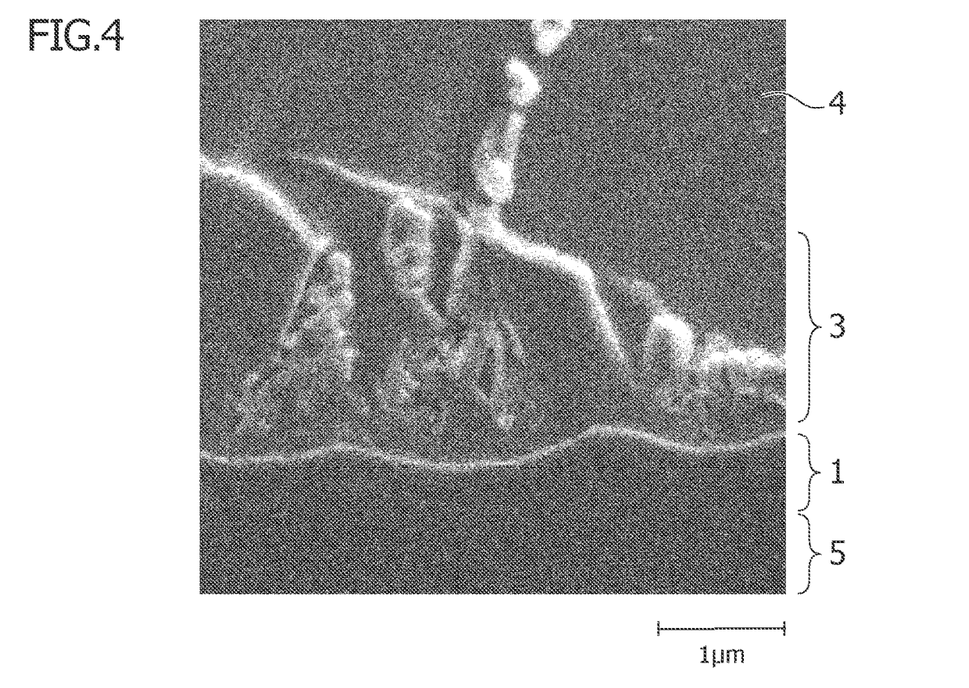
FIG. 4 is a cross-sectional photograph of a solder joint of Example 8 taken with a scanning electron microscope.

FIG. 4 presents a representative cross-section observation photograph of the solder joint of Example. FIG. 4 is a scanning electron microscope (SEM) photograph of the solder joint (Example 8) when the plating composition is such that Cu is 2% by mass, P is 8% by mass, and the balance is Ni, and the solder composition is the same as before, and the joining is performed under the same conditions as above. On the other hand, FIG. 5 is a scanning electron micrograph of a solder joint (Comparative Example 4) when the plating composition is such that P is 8% by mass and the balance is Ni, the solder composition is the same as the above, and the joining is performed under the same conditions as above. In FIG. 5, holes h having a diameter of about 0.1 to 0.5 μm were found in the P-enriched layer 101. As can be seen from FIG. 4, in the joint in an Example, almost no holes were observed near the interface between the Ni—Cu—P plating layer and the solder joint layer.

Identification of Microcrystals by Transmission Microscope Observation

Figure 6:
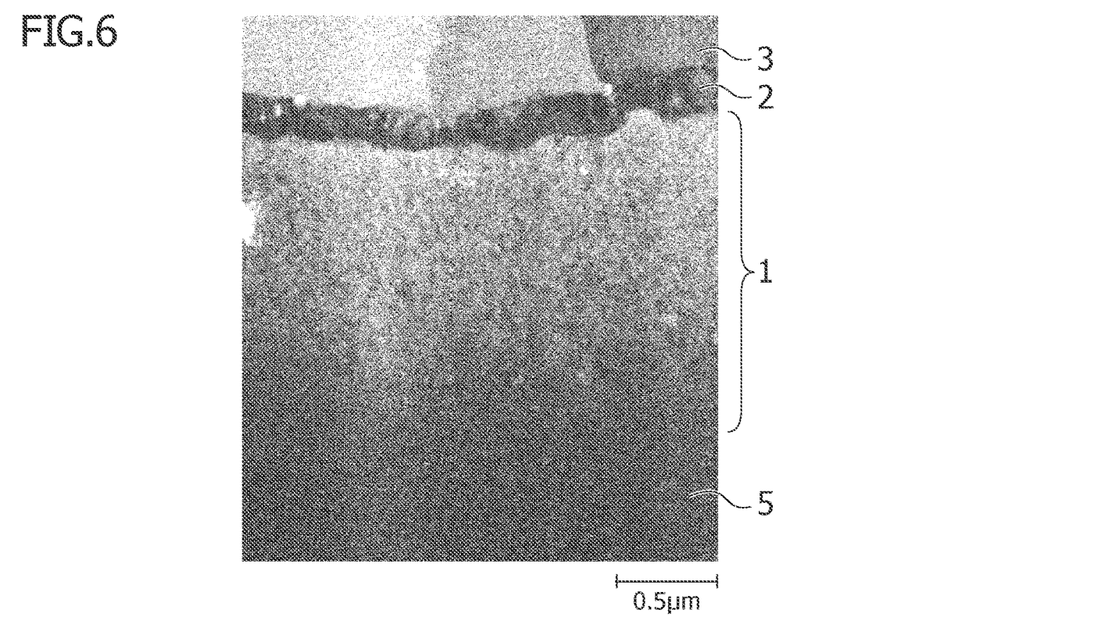
FIG. 6 is a transmission micrograph of a cross section of the solder joint of Example 8.
Figure 7:
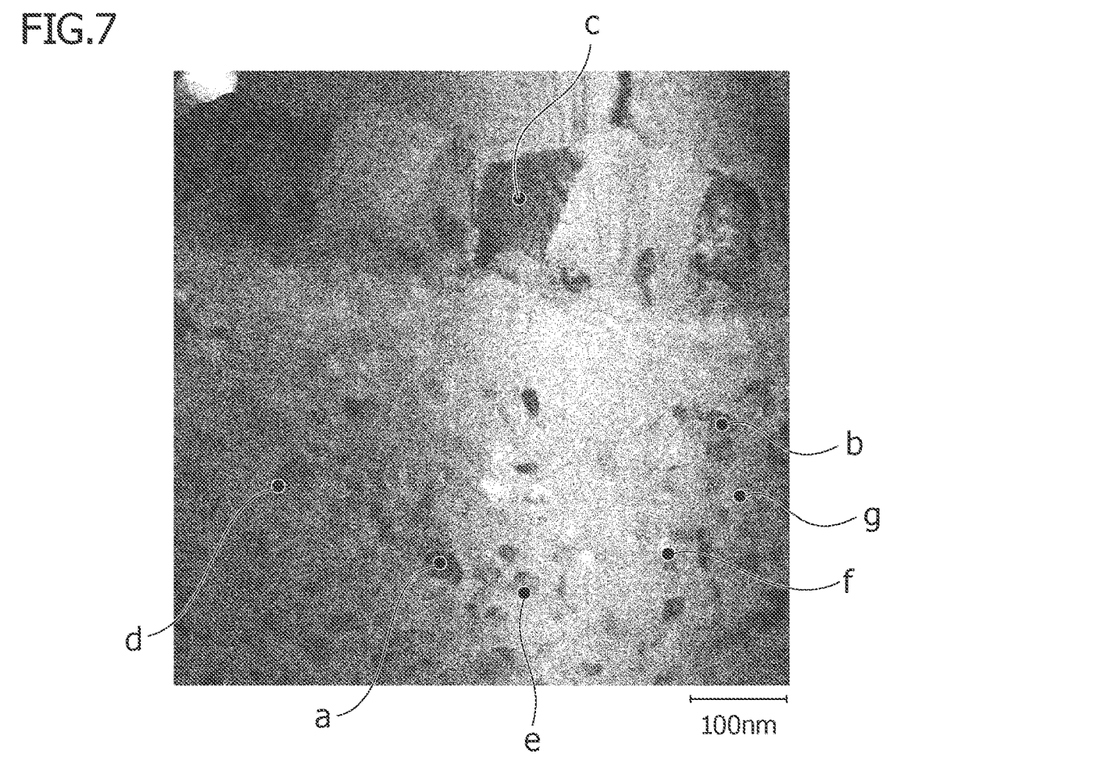
FIG. 7 is an enlarged photograph of FIG. 6.

FIG. 6 is a transmission electron micrograph of the interface of the solder joint of Example 8. At the joint interface, there were layers of $(Ni,Cu)_3(Sn,Sb)_2$ compound and $Ni_3(Sn,Sb)_2$ compound from the solder side in the upper part of the photograph, and it was confirmed that fine granular crystals of about 5 nm to 20 nm had a layered structure construct at that interface. FIG. 7 is an enlarged photograph of the upper left part of FIG. 6, and the elemental analysis results for "a" were such that P was 21.8 at %, Ni was 75.1 at %, and Cu was 2.6 at %, and it was confirmed that the microcrystals were in the microcrystalline layer in which Ni:P was about 3:1 with slightly coexisting Cu.

Similarly, the elemental analysis results for "b" were such that P was 22.4 at %, Ni was 75.8 at %, and Cu was 1.2 at %, and it was confirmed that the fine particulate matter observed in the transmission electron micrograph was (Ni, Cu)$_3$P microcrystals in the microcrystalline layer composed of Ni, P, and Cu. In "c", compound layers arranged in layers were confirmed. The EDX analysis results for "c confirmed that Ni was 52.6 at %, Sn 40.6 at %, and Sb 5.2 at %, which was presumed to be the Ni$_3$(Sn,Sb)$_2$ compound layer of the first intermetallic compound layer. The EDX analysis results for "d" confirmed that the ratio was about Ni:P=3.7:1, and Cu was as low as 0.15 at % or less, and thus, it could be confirmed as a Ni$_3$P phase. Similarly, it was estimated that "e" was (Ni,Cu)$_5$P$_2$ microcrystals, "f" was (Ni,Cu)$_{12}$P$_5$ microcrystals, and "g" was (Ni,Cu)$_2$P microcrystals. Note that the diffraction spots of the diffraction pattern were also clear by electron beam diffraction using a transmission electron microscope, and it was found that these existed as crystals. At points "a", "b, and "d" to "g" other than the point "c" indicating the first intermetallic compound layer, Ag, Sn, and Sb derived from the solder components were scarcely contained in any of them.

Table 2 below presents the EDX analysis results of the portions indicated by "a", "b", "c", "d", "e", "f", and "g" in the photograph of FIG. 7. Numerical values in the table represent atomic % (at %).

TABLE 2

|    | a | b | c | d | e | f | g |
|----|------|------|-------|-------|-------|-------|-------|
| P  | 21.80 | 22.36 | 0.45 | 21.23 | 26.55 | 28.41 | 31.54 |
| Ni | 75.11 | 75.81 | 52.65 | 78.25 | 71.53 | 70.12 | 66.95 |
| Cu | 2.66 | 1.16 | 0.71 | 0.15 | 1.6 | 1.18 | 1.22 |
| Ag | 0.18 | 0.12 | 0.37 | 0.14 | 0.10 | 0.11 | 0.13 |
| Sn | 0.25 | 0.49 | 40.62 | 0.23 | 0.22 | 0.18 | 0.16 |
| Sb | 0.00 | 0.05 | 5.19 | 0.00 | 0.00 | 0.00 | 0.00 |

Figure 9:
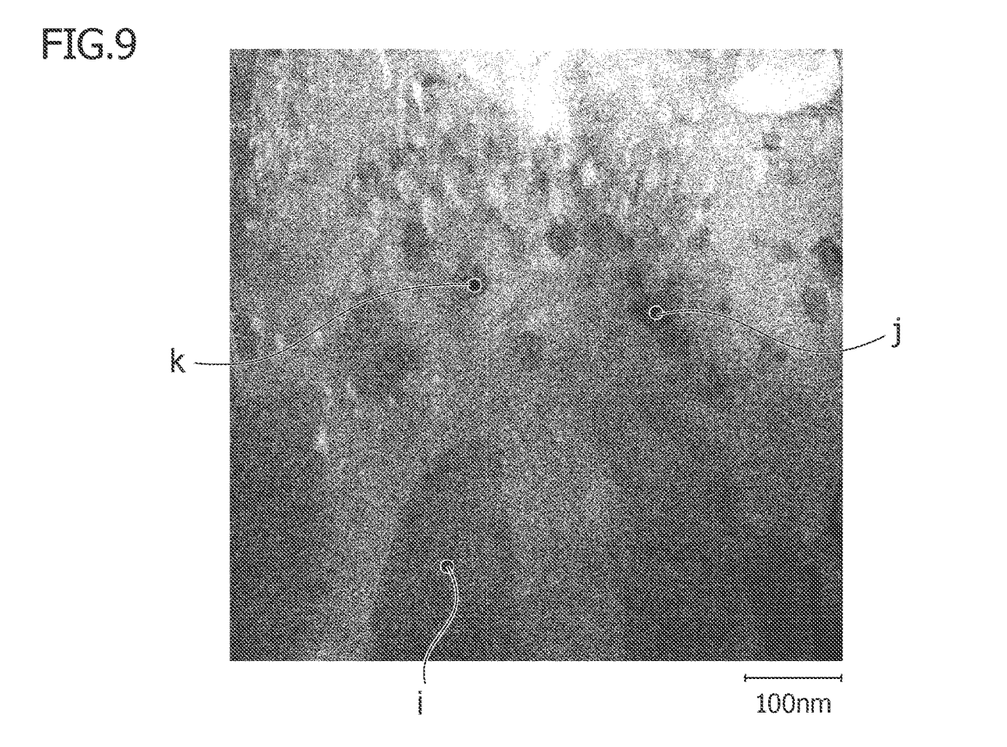
FIG. 9 is an enlarged photograph of FIG. 8.

FIG. 8 is a transmission electron micrograph of the interface of the solder joint of Comparative Example 4. The structure of the joint interface between the solder joint layer and the Ni—P plating layer is, from the top of the photo on the solder side, Ni$_3$Sn$_4$ compound layer (second intermetallic compound layer 103)/Ni$_3$Sn$_2$ compound layer (first intermetallic compound layer 102)/coarsened fine grain layer (101c)/columnar crystal phase (101d)/coarsened fine grain transition layer/the Ni—P plating layer and the joint interface have different layer structures. FIG. 9 presents an enlarged photograph of the vicinity of the columnar crystals in FIG. 8.

In addition, the results of EDX analysis of the portions "i", "j", and "k" in FIG. 9 are presented below. Numerical values in the table represent atomic % (at %).

TABLE 3

|    | i | j | k |
|----|-------|-------|-------|
| P  | 26.27 | 23.95 | 25.92 |
| Ni | 73.51 | 75.81 | 74.08 |
| Cu | 0.00 | 0.00 | 0.00 |
| Ag | 0.22 | 0.00 | 0.00 |
| Sn | 0.00 | 0.24 | 0.00 |
| Sb | 0.00 | 0.00 | 0.00 |

In FIG. 9, coarse Ni columnar crystals of about 50 to 500 nm were confirmed at the portion indicated by "i". The EDX quantitative analysis results of this portion were such that P was 26.27 at % and Ni was 73.51 at %, which confirmed that the compound was composed of Ni$_3$P. In FIG. 9, a granular compound was confirmed in the portion indicated by "j" near the columnar crystals. The EDX quantitative analysis results of this part were such that P was 23.9 at % and Ni was 75.8 at %. The EDX quantitative analysis results of the portion indicated by "k" in FIG. 9 were such that P was 25.9 at % and Ni was 74.1 at %, and it was presumed that the crystals present in any portion of "j" and "k" were crystals made of Ni$_3$P.

From the results of the observation of the structure construct by with a transmission electron microscope and EDX quantitative analysis of Example 8 and Comparative Example 4, it was found that, in the Ni—P—Cu plating layer of Example 8, a fine granular layer of about 5 to 20 nm was formed in the plating layer at the joint interface. On the other hand, in Comparative Example 4, the Ni—P plating layer was composed of a fine structure including coarsened defects (holes) and a structure of coarse columnar crystals of about 50 to 500 nm. In order to suppress the defects at the joint interface in Example, the crystal structure made of NiP was replaced with Cu, and the structure fine. It was considered that the fine dense layer had a great relation to the improvement of heat resistance.

Comparison of Number of Holes by Observation with Transmission Microscope

Regarding the joined bodies of Example 8 and Comparative Example 4 subjected to heat treatment at 175° C. for 250 hours, the number of holes was counted per observation field of 0.36 μm$^2$ when the cross section was observed with a transmission electron microscope at 80,000 magnification. The number of holes of 10 nm or larger was counted in the observation field (0.36 μm$^2$) of the microcrystalline layer for the joints of Examples and the P-enriched layer for the joints of Comparative Examples. As a result, the number of holes was about 45 at the joint of Example 8, whereas it was about 230 in Comparative Example 4, and the number of holes generated could be reduced to about ⅕. Also, in other Examples, the number of holes of 10 nm or greater could be suppressed to 50 or less in the unit area. The evaluation of holes by SEM observation was targeted for holes of 0.1 μm or greater, but further evaluation with high resolution such as TEM revealed the existence of even smaller holes. Then, it was also found that, in the case of the plated film according to the invention of the present application, fine holes were also suppressed.

From the above results, use of the Ni—P—Cu plated film and the solder material according to the present invention made it possible to form a reliable joint with fewer holes near the joint interface. Specifically, the number of large holes of 0.1 μm or greater observable by SEM was 2 or less per 100 μm$^2$ of observation field, and the number of holes of 10 nm or greater in TEM observation was 50 or less per 0.36 μm$^2$ of the observation field.

Other than the solder materials having compositions other than the solder material used in the present Examples and the solder materials presented in the above solder materials, it is considered that similar results can be obtained for Sn-0.75Cu solder material (solder material containing 0.75% by mass of Cu, in which the balance is Sn and inevitable impurities), Sn-0.6Cu-0.05Ni solder material (solder material containing 0.6% by mass of Cu and 0.05% by mass of Ni, in which the balance is Sn and inevitable impurities), and Sn-0.3Ag-0.5Cu solder material (solder material containing 0.3% by mass of Ag and 0.5% by mass of Cu, in which the balance is Sn and inevitable impurities), for example.

INDUSTRIAL APPLICABILITY

The solder joint according to the present invention is used for joints of general electronic devices with large current specifications, and in particular, it is preferably used for package components such as ICs. In addition, the usage thereof includes components that generate a large amount of heat, for example, LED elements and die-bond joints of power semiconductor devices such as power diodes, and further, the usage preferably includes die-bond joints for internal connection of IC elements and the like, and joints between any metal members in general electronic components mounted on printed wiring boards and the like.

REFERENCE SYMBOL LIST 1 microcrystalline layer
2 first intermetallic compound layer
3 second intermetallic compound layer
4 solder layer
5 Ni—P—Cu plating layer
6 base material layer
P Q R S solder joint
10 joint layer
11 semiconductor element
12 laminate substrate
13 heat sink
14 aluminum wire
15 external terminal
16 case
17 resin sealing material
18 lead frame
100 power module
101 P-enriched layer
102 first intermetallic compound layer
103 second intermetallic compound layer
104 solder layer
105 Ni—P plating layer
106 base material layer
h hole

What is claimed is:

1. A solder joint comprising:
    a solder joint layer having a melted solder material containing Sn as a main component and further containing Ag and/or Sb and/or Cu; and
    a joined body including a Ni—P—Cu plating layer on a surface in contact with the solder joint layer, wherein
    the Ni—P—Cu plating layer contains Ni as a main component and contains 0.5% by mass or greater and 8% by mass or less of Cu and 3% by mass or greater and 10% by mass or less of P,
    the Ni—P—Cu plating layer has a microcrystalline layer at an interface with the solder joint layer, and the microcrystalline layer includes a phase containing microcrystals of a NiCuP ternary alloy, a phase containing microcrystals of $(Ni,Cu)_3P$, and a phase containing microcrystals of $Ni_3P$.

2. The solder joint according to claim 1, wherein the microcrystals of the NiCuP ternary alloy include microcrystals having an average particle diameter of about 10 nm or less.

3. The solder joint according to claim 1, wherein the microcrystalline layer is free of columnar crystals or particles having a major axis of 75 nm or greater.

4. The solder joint according to claim 1, wherein the solder material contains Sn, Ag, and Sb.

5. The solder joint according to claim 4, wherein the solder material further contains Ni and/or Ge and/or Cu.

6. The solder joint according to claim 1, wherein the joined body including the Ni—P—Cu plating layer is a member in which an electroless Ni—P—Cu plating layer is provided on a base material containing Cu, Al, or a Cu alloy as a main component.

7. An electronic device comprising the solder joint according to claim 1.

8. A semiconductor device comprising the solder joint according to claim 1.

9. The semiconductor device according to claim 8, wherein the solder joint is a joint between a substrate electrode, a lead frame, or an implant pin and a semiconductor element, a joint between a conductive plate and a heat sink, and/or a joint between terminals.

10. The semiconductor device according to claim 9, wherein the semiconductor element is a Si semiconductor element or a SiC semiconductor element.

* * * * *